(12) United States Patent
Yanagida et al.

(10) Patent No.: US 10,438,832 B2
(45) Date of Patent: Oct. 8, 2019

(54) SEMICONDUCTOR DEVICE, SEMICONDUCTOR WAFER AND SEMICONDUCTOR DEVICE MANUFACTURING METHOD

(71) Applicant: UBIQ Semiconductor Corp., Zhubei, Hsinchu County (TW)

(72) Inventors: Masamichi Yanagida, Gunma-ken (JP); Nobuyoshi Matsuura, Gunma-ken (JP)

(73) Assignee: uPI SEMICONDUCTOR CORP., Zhubei, Hsinchu County (TW)

( * ) Notice: Subject to any disclaimer, the term of this patent is extended or adjusted under 35 U.S.C. 154(b) by 0 days.

(21) Appl. No.: 15/951,570

(22) Filed: Apr. 12, 2018

(65) Prior Publication Data

US 2018/0301366 A1 Oct. 18, 2018

(30) Foreign Application Priority Data

Apr. 13, 2017 (JP) ................. 2017-079523

(51) Int. Cl.
| | |
|---|---|
| *H01L 31/062* | (2012.01) |
| *H01L 31/113* | (2006.01) |
| *H01L 29/788* | (2006.01) |
| *H01L 21/30* | (2006.01) |
| *H01L 21/46* | (2006.01) |
| *H01L 21/28* | (2006.01) |
| *H01L 21/44* | (2006.01) |
| *H01L 21/683* | (2006.01) |
| *H01L 21/304* | (2006.01) |
| *H01L 23/31* | (2006.01) |
| *H01L 21/78* | (2006.01) |

(52) U.S. Cl.
CPC ........ *H01L 21/6836* (2013.01); *H01L 21/304* (2013.01); *H01L 21/3043* (2013.01); *H01L 21/78* (2013.01); *H01L 23/3114* (2013.01); *H01L 2221/68327* (2013.01)

(58) Field of Classification Search
CPC ... H01L 21/6836; H01L 21/304; H01L 21/78; H01L 23/3114
USPC .................. 257/290, 315; 438/459, 576
See application file for complete search history.

(56) References Cited

U.S. PATENT DOCUMENTS

| | | | |
|---|---|---|---|
| 8,785,296 B2 | 7/2014 | Xue et al. | |
| 9,196,534 B2 | 11/2015 | Xue et al. | |
| 2005/0098815 A1* | 5/2005 | Okita | H01L 27/0629 257/306 |
| 2008/0242052 A1 | 10/2008 | Feng et al. | |
| 2008/0283900 A1* | 11/2008 | Nakagawa | H01L 27/105 257/321 |
| 2009/0230452 A1* | 9/2009 | Takahashi | H01L 27/11526 257/315 |

* cited by examiner

*Primary Examiner* — David S Blum
(74) *Attorney, Agent, or Firm* — McClure, Qualey & Rodack, LLP

(57) ABSTRACT

A semiconductor device manufacturing method is disclosed. The semiconductor device manufacturing method includes: a preparation step of preparing a semiconductor wafer; a removal step of removing a thickness part of the semiconductor wafer; and a cutting step of cutting the semiconductor wafer. In the removal step, a rib-shaped portion partially raised on a second main surface of the semiconductor wafer is used as an alignment mark, so that a cutter can align with the semiconductor wafer.

10 Claims, 8 Drawing Sheets

SEMICONDUCTOR DEVICE, SEMICONDUCTOR WAFER AND SEMICONDUCTOR DEVICE MANUFACTURING METHOD

BACKGROUND OF THE INVENTION

1. Field of the Invention

The invention relates to a semiconductor device; in particular, to a semiconductor device, a semiconductor wafer and a semiconductor device manufacturing method.

2. Description of the Prior Art

In general, the semiconductor device manufacturing method includes: a step of using a diffusion technology to form a diffusion region of a semiconductor device (e.g., a transistor) around a surface of a semiconductor wafer; a step of forming a conductive pattern connected with the diffusion region on the surface of the semiconductor wafer; and a step of cutting the semiconductor wafer into individual semiconductor devices.

In addition, when thinning the semiconductor wafer, a thickness of the peripheral portion of the semiconductor wafer will be kept to ensure the rigidity of the semiconductor wafer. Therefore, a manufacturing method called TAIKO process, which can prevent the semiconductor wafer from being damaged during handling process and reduce wafer warpage, is developed accordingly. (Please refer to the website: https://www.disco.co.jp/jp/solution/library/taiko.html, searched on Feb. 23, 2017.) Furthermore, the semiconductor device manufacturing methods similar to the TAIKO process can be referred to the following US patents: US 2014/0242756, US 2013/0210215, and US 2008/0242052.

Please refer to FIG. 8A, FIG. 8B and FIG. 8C. FIG. 8A, FIG. 8B and FIG. 8C illustrate the semiconductor device manufacturing method using the TAIKO process, wherein FIG. 8A, FIG. 8B and FIG. 8C illustrate cross-sectional diagrams of the semiconductor device manufacturing method in order.

As shown in FIG. 8A, at first, a conductive pattern 101 is formed on a first surface of a semiconductor wafer 100 and the first surface of the semiconductor wafer 100 is adhered with a back grinding tape 102. A plurality of semiconductor device portions (not shown in FIG. 8A) used as semiconductor devices is formed in matrix on the semiconductor wafer 100.

As shown in FIG. 8B, a grinder is used to grind the semiconductor wafer 100 from above to reduce the thickness of the semiconductor wafer 100. It is only the region that the semiconductor device portions are formed is grinded instead of the entire semiconductor wafer 100 being grinded, so that the thick wall portion of the peripheral edge of the wafer 100 can be kept. By doing so, not only the rigidity of the semiconductor wafer 100 can be ensured to facilitate the manufacturing process of the semiconductor wafer 100, but also the warpage of the semiconductor wafer 100 can be suppressed.

As shown in FIG. 8C, the grinded semiconductor wafer 100 is separated from the back grinding tape 102, and a second surface of the semiconductor wafer 100 without conductive pattern is adhered with a cutting tape 103. Then, the thick wall portion of the peripheral edge of the semiconductor wafer 100 is removed, and the semiconductor wafer 100 is reversed. Under this condition, the conductive pattern 101 formed on the first surface of the semiconductor wafer 100 is used as an alignment mark for a cutter 104 to align with the semiconductor wafer 100. Then, the high-speed rotary cutter 104 is used to cut the semiconductor wafer 100 to obtain individual semiconductor devices.

SUMMARY OF THE INVENTION

However, even the semiconductor device manufacturing method such as TAIKO process is used, it is hard to control the cutter to cut the semiconductor wafer 100 correctly. In detail, in order to cut the semiconductor wafer 100 into individual semiconductor devices correctly, the cutter 104 must to correctly align with cutting lines formed between the semiconductor device portions on the semiconductor wafer 100.

In general, the photographic device (e.g., the camera) is used to take a picture of the conductive pattern 101 or the alignment mark on the semiconductor wafer 100, and then the positions of the semiconductor device portions on the semiconductor wafer 100 can be calculated according to the picture for the cutter 104 to align with the semiconductor wafer 100. However, the above-mentioned alignment process is too complicated.

In addition, when the TAIKO process (e.g., using the cutter 104) is used to cut the thinned semiconductor wafer 100 having a thickness smaller than or equal to 100 μm, because the stress or impact applied by the cutter 104, even if the semiconductor wafer 100 is small, it may cause damage to the semiconductor wafer 100.

Furthermore, when the conductive adhesive (e.g., the solder) is used to adhere the semiconductor devices manufactured by the above-mentioned steps, it is very likely that the conductive adhesive melted on the semiconductor devices spreads excessively into the surroundings.

Therefore, the invention provides a semiconductor device, a semiconductor wafer and a semiconductor device manufacturing method to simplify the aligning step of the semiconductor wafer cutting process.

An embodiment of the invention is a semiconductor device. In this embodiment, the semiconductor device includes a semiconductor substrate, a conductive pattern and a peripheral protrusion. The semiconductor substrate has a first surface and a second surface opposite to the first surface. A diffusion region is formed in the semiconductor substrate. The conductive pattern is formed on the first surface and electrically connected with the diffusion region. A peripheral protrusion is formed at a peripheral portion of the second surface and protrudes outwardly along a thickness direction.

Therefore, when the conductive adhesive (e.g., the solder) is used to adhere with the second surface, the conductive adhesive will contact with the peripheral protrusion formed at the peripheral portion of the second surface to prevent the conductive adhesive from spreading excessively into the surroundings.

In an embodiment of the invention, the second surface with the peripheral protrusion is covered by a back metal. Therefore, not only the resistance of the circuit formed on the semiconductor substrate can be reduced, but also the adhesion of the conductive adhesive such as solder can be also improved.

Another embodiment of the invention is a semiconductor wafer. In this embodiment, the semiconductor wafer includes a semiconductor substrate, a first surface, a second surface and a rib-shaped portion. A plurality of semiconductor device portions is arranged in matrix on the semiconductor substrate. A conductive pattern is disposed on the first surface and electrically connected with a diffusion region formed in the semiconductor device portion. The second surface is opposite to the first surface. The rib-shaped portion is formed on the second surface corresponding to a region between the semiconductor device portions and protrudes outwardly along a thickness direction. The rib-shaped portion is formed in a lattice shape as a whole.

Therefore, in the cutting step, the rib-shaped portion formed in the removal step is used as an alignment remark for easily cutting the semiconductor wafer into semiconductor devices in the cutting step.

In an embodiment of the invention, the second surface with the rib-shaped portion is covered by a back metal.

Therefore, even the second surface of the semiconductor wafer is covered by the back metal, in the cutting step, the position of the rib-shaped portion formed on the second surface can be visually recognized and used for cutting the semiconductor wafer into semiconductor devices.

Another embodiment of the invention is a semiconductor device manufacturing method. In this embodiment, the semiconductor device manufacturing method includes:

a preparation step of preparing a semiconductor wafer, including:

arranging a plurality of semiconductor device portions in matrix on a semiconductor substrate;

disposing a conductive pattern on a first surface wherein the conductive pattern is electrically connected with a diffusion region formed in the semiconductor device portion; and providing a second surface opposite to the first surface;

a removal step of removing a thickness part of the semiconductor wafer corresponding to the semiconductor device portion from the second surface; and a cutting step of cutting the semiconductor wafer into the semiconductor device portion, in the removal step, a rib-shaped portion protruding outwardly along a thickness direction is formed on the second surface corresponding to a region between the semiconductor device portions, in the cutting step, cutting the semiconductor wafer along the rib-shaped portion.

Therefore, in the cutting step, the rib-shaped portion formed in the removal step is used as an alignment remark for easily cutting the semiconductor wafer into semiconductor devices in the cutting step. In addition, although the thickness of the semiconductor wafer after the removal step is reduced to, for example, several tens of μm, the grid-like rib-shaped portion formed on the second surface can reinforce the semiconductor wafer. Moreover, when the semiconductor wafer is cut along the rib-shaped portion, the stress acted on the semiconductor wafer during the cutting process can be reduced and the damage to the semiconductor wafer during the cutting process can be also avoided.

In an embodiment of the invention, in the removal step, a thickness of a peripheral portion of the semiconductor wafer is kept.

Therefore, the thickness of the peripheral portion of the semiconductor wafer can ensure the rigidity of the semiconductor wafer to facilitate the manufacturing process of the semiconductor wafer and suppress the warpage of the semiconductor wafer.

In an embodiment of the invention, in the removal step, under a condition that the first surface of the semiconductor wafer is adhered with a first tape, the second surface of the semiconductor wafer is pushed and grinded by a grinder, and the semiconductor wafer corresponding to a region between the semiconductor device portions is deformed toward the first surface to form the rib-shaped portion on the second surface corresponding to the region between the semiconductor device portions.

Therefore, since the rib-shaped portion can be formed by using the grinder to push and grind the second surface of the semiconductor wafer, no other manufacturing step is necessary, and the rib-shaped portion can be used as the alignment remark for cutting the semiconductor wafer in the cutting step.

In an embodiment of the invention, in the cutting step, the semiconductor wafer is cut under the condition that the first surface of the semiconductor wafer is adhered with the first tape.

Therefore, since there is no need to separate the first tape from the semiconductor wafer, the semiconductor wafer can be prevented from being damaged during the separating step and the warpage of the semiconductor wafer during transportation can be suppressed.

In an embodiment of the invention, in the cutting step, the semiconductor wafer is cut under the condition that the first tape is adhered with a second tape.

Therefore, since there is no need to separate the first tape from the semiconductor wafer before the cutting step is performed, the semiconductor wafer can be prevented from being deformed or damaged due to the separating step.

The advantage and spirit of the invention may be understood by the following detailed descriptions together with the appended drawings.

BRIEF DESCRIPTION OF THE APPENDED DRAWINGS

FIG. 1A and FIG. 1B illustrate schematic diagrams of the semiconductor device in an embodiment of the invention, wherein FIG. 1A is a cross-sectional diagram of the semiconductor device and FIG. 1B is a cross-sectional diagram of the semiconductor device packaging structure.

FIG. 2A and FIG. 2B illustrate schematic diagrams of the semiconductor device in another embodiment of the invention, wherein FIG. 2A is a cross-sectional diagram of the semiconductor device and FIG. 2B is a cross-sectional diagram of the semiconductor device packaging structure.

FIG. 3A and FIG. 3B illustrate schematic diagrams of the semiconductor device manufacturing method in another embodiment of the invention, wherein FIG. 3A is a plan view of the semiconductor wafer and FIG. 3B is a cross-sectional diagram of semiconductor wafer.

FIG. 4A and FIG. 4B illustrate schematic diagrams of the semiconductor device manufacturing method in another embodiment of the invention, wherein FIG. 4A and FIG. 4B are cross-sectional diagrams of the semiconductor wafer grinding step.

Figure 5A:
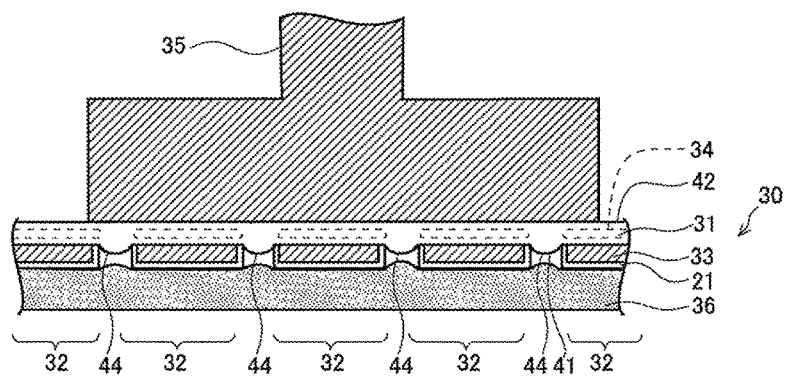
Figure 5B:
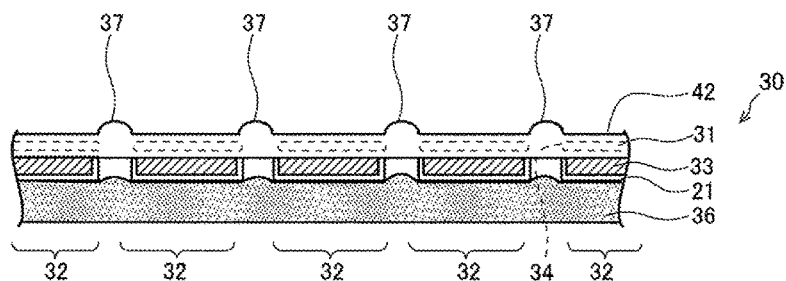
Figure 5C:
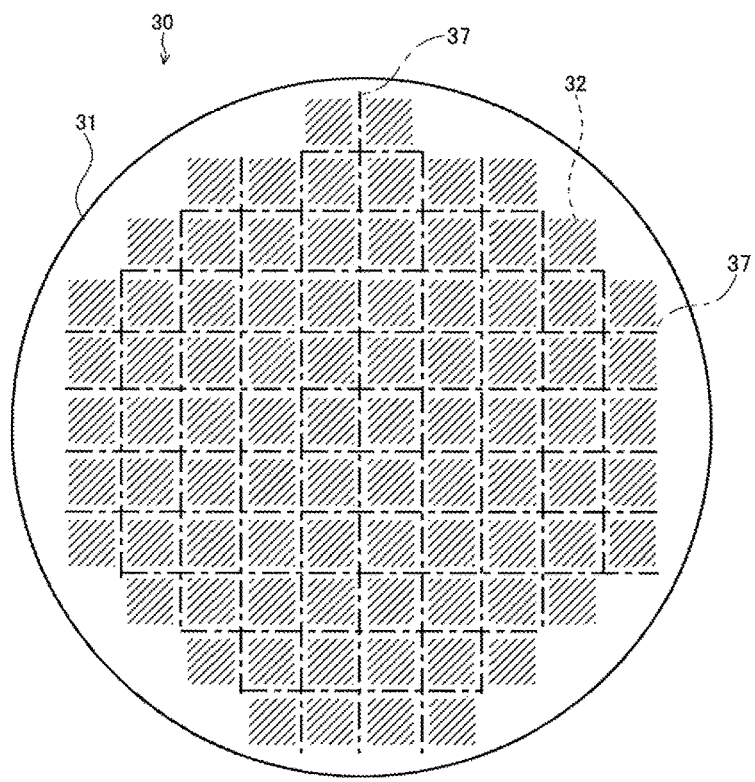

FIG. 5A~FIG. 5C illustrate schematic diagrams of the semiconductor device manufacturing method in another embodiment of the invention, wherein FIG. 5A and FIG. 5B are cross-sectional diagrams of the back grinding step and FIG. 5C is a plan view of the semiconductor wafer.

Figure 6:
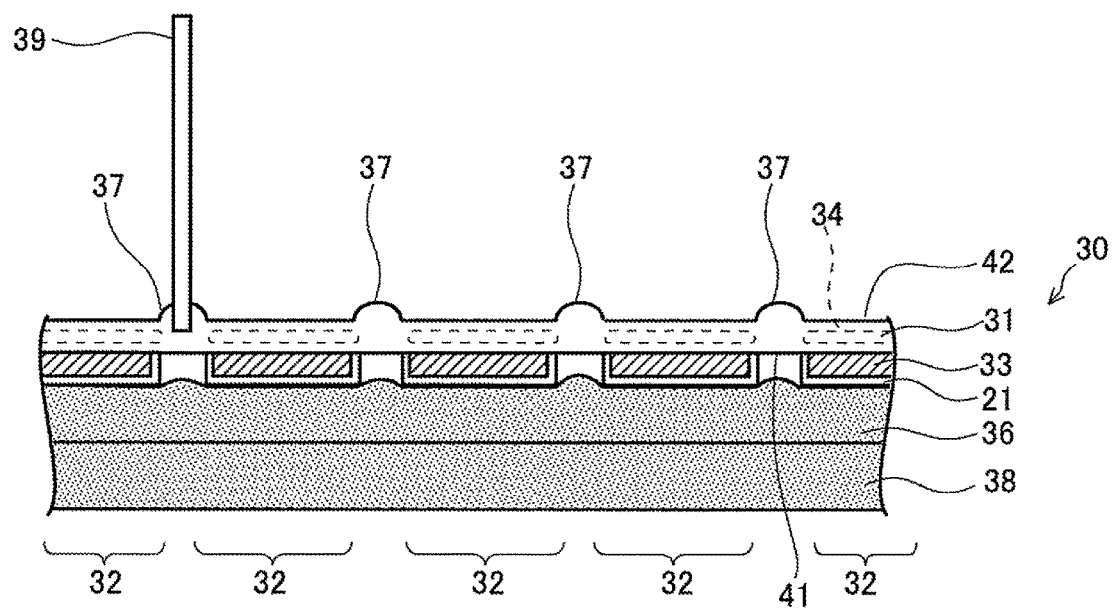

FIG. 6 illustrates a cross-sectional diagram of the semiconductor device manufacturing method in another embodiment of the invention.

Figure 7A:
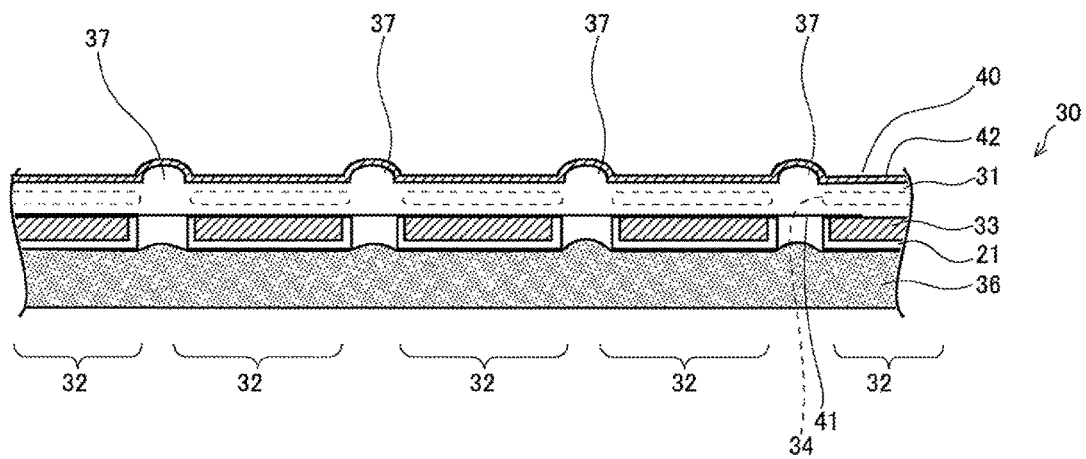
Figure 7B:
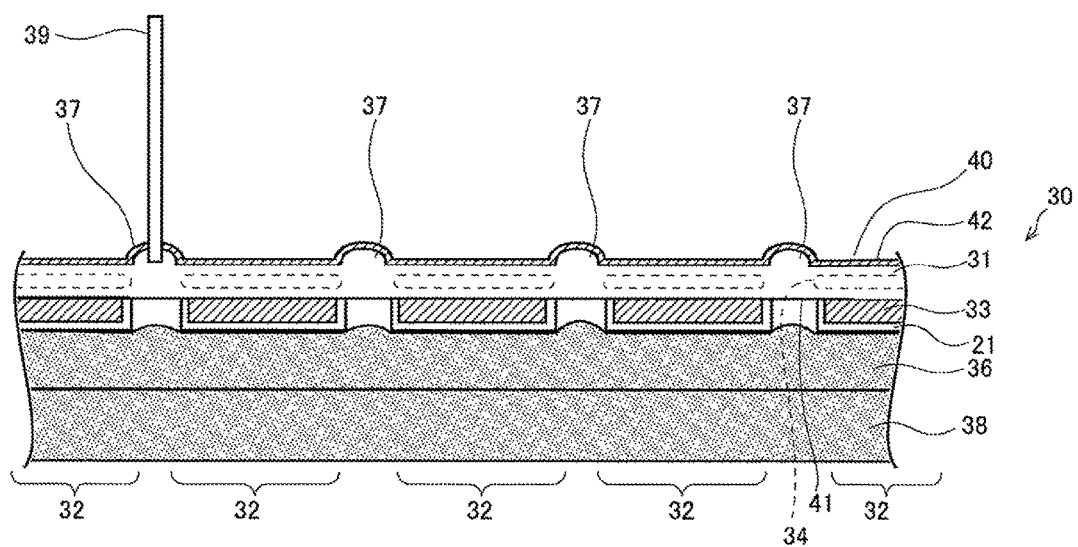

FIG. 7A and FIG. 7B illustrate schematic diagrams of the semiconductor device manufacturing method in another embodiment of the invention, wherein FIG. 7A and FIG. 7B are cross-sectional diagrams.

Figure 8A:
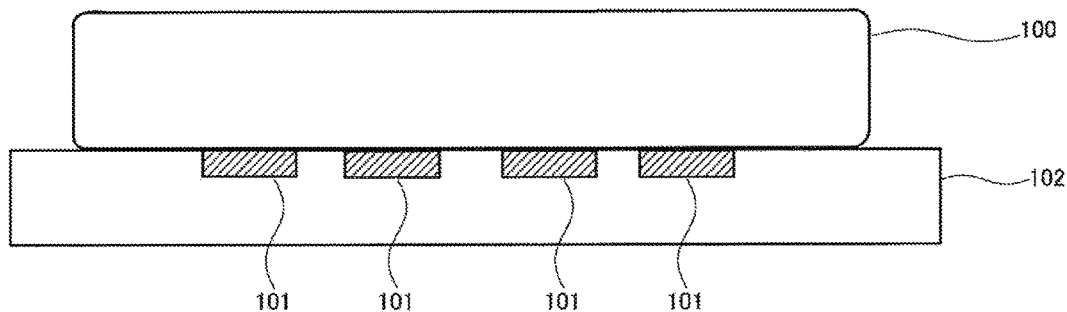
Figure 8B:
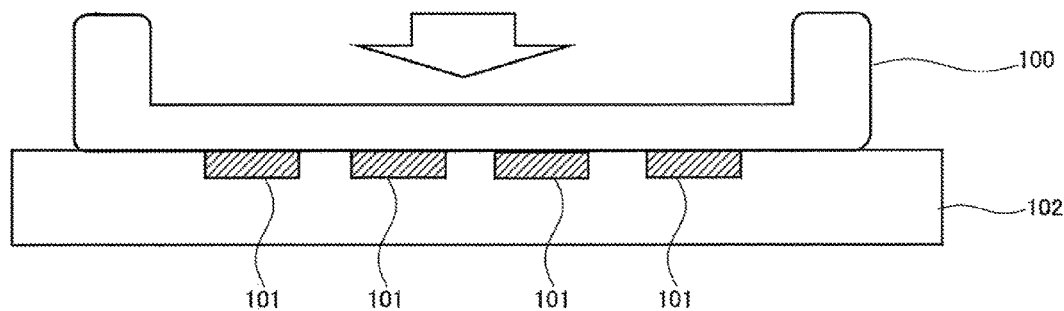
Figure 8C:
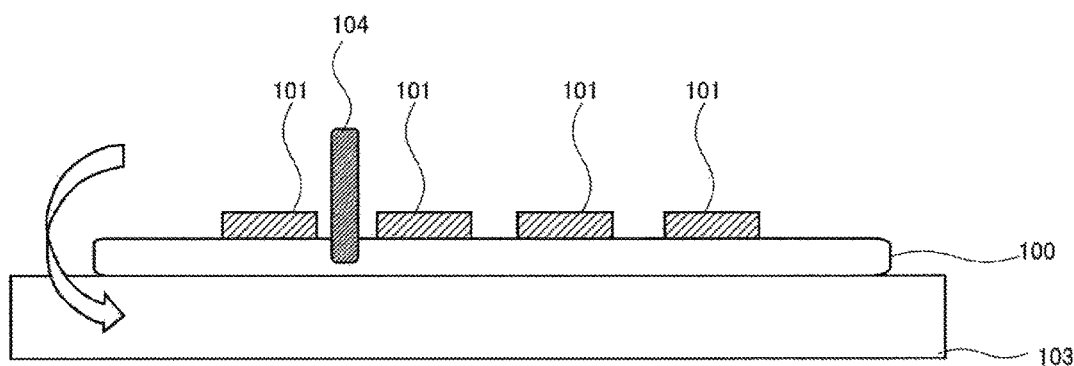

FIG. 8A~FIG. 8C illustrate schematic diagrams of the semiconductor device manufacturing method in the prior art, wherein FIG. 8A~FIG. 8C are cross-sectional diagrams.

DETAILED DESCRIPTION OF THE INVENTION

Exemplary embodiments of the semiconductor device 10, the semiconductor wafer 30 and the manufacturing method of the semiconductor device 10 in the present invention are referenced in detail now, and examples of the exemplary embodiments are illustrated in the drawings. Further, the same or similar reference numerals of the elements/components in the drawings and the detailed description of the invention are used on behalf of the same or similar parts.

Figure 1A:
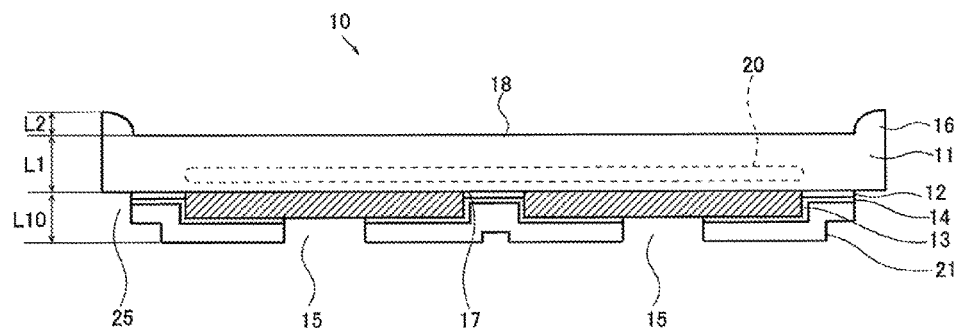

Please refer to FIG. 1A, the semiconductor device 10 is a small semiconductor device called wafer level package (WLP). The semiconductor device 10 includes a semiconductor substrate 11 formed by semiconductor material such as silicon. The semiconductor substrate 11 has a thickness L1 and for example, the thickness L1 ranges from 50 µm~200 µm. The semiconductor substrate 11 has a first surface 17 as a lower surface and a second surface 18 as an upper surface. If viewed from above, the semiconductor substrate 11 has a rectangular shape. In addition, a diffusion region 20 is formed near the first surface 17 of the semiconductor substrate 11 to construct semiconductor elements such as transistor or diode.

The first surface 17 of the semiconductor substrate 11 is covered by an oxide film 12 such as silicon dioxide ($SiO_2$). In addition, a conductive pattern 13 electrically connected with the diffusion region 20 is formed on the first surface 17 of the semiconductor substrate 11. The first surface 17 of the semiconductor substrate 11 and the conductive pattern 13 are both covered by a passivation layer 14. The passivation layer 14 can be formed by silicon nitride ($Si_3N_4$) or a resin insulation film such as polyimide. The passivation layer 14 can be covered by a resin film 21 such as polyimide.

In addition, a concave region 25 is formed on a peripheral edge portion of the semiconductor substrate 11 by removing the oxide film 12, the passivation layer 14 and the resin film 21. As described later, the concave region 25 is formed by forming a scribe line on the semiconductor wafer 30. In the concave region 25, a step difference is formed between the bottom of the resin film 21 and the bottom of the semiconductor substrate 11 and the step difference has a thickness L10, for example 13 µm.

An opening 15 is formed by partially opening the passivation layer 14, and a part of the conductive pattern 13 is exposed from the opening 15. The semiconductor device 10 is electrically connected to outside through the exposed part of the conductive pattern 13.

In the semiconductor device 10 of this embodiment, a peripheral protrusion 16 is formed by partially protruding a peripheral edge portion of the second surface 18 of the semiconductor substrate 11 upward. As seen from above, the peripheral protrusion 16 located at the peripheral edge portion of the quadrilateral semiconductor substrate 11 is slightly frame-shaped. The peripheral protrusion 16 protruding upward from the second surface 18 has a height L2, for example, 5 µm~10 µm.

Figure 1B:
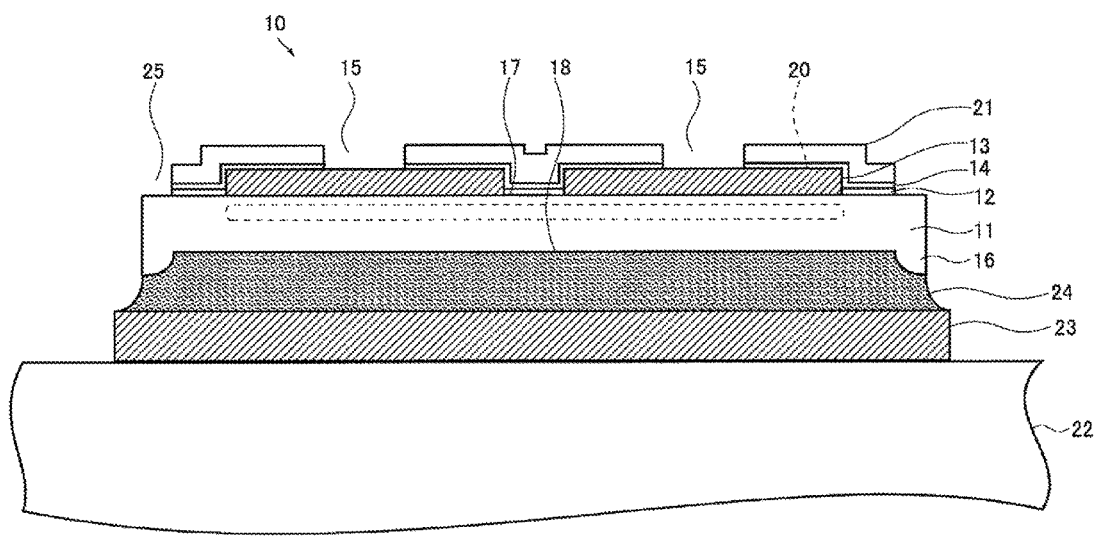

Please refer to FIG. 1B. FIG. 1B is a cross-sectional diagram of packaging the semiconductor device 10 having the above-mentioned structure. In this embodiment, a package type of the semiconductor device 10 is to package the semiconductor device 10 on a conductive path 23 formed on a package 22. However, another package type of the semiconductor device 10 is to package the semiconductor device 10 on a lead frame.

In this embodiment, the semiconductor device 10 is packaged on the conductive path 23 of the package substrate 22 with the first surface 17 as an upper surface and the second surface 18 as a lower surface. In addition, the second surface 18 of the semiconductor device 10 is fixed and adhered on the conductive path 23 through a conductive adhesive 24. The conductive adhesive 24 can be solder or conductive paste such as silver paste. Furthermore, the exposed conductive pattern 13 on the semiconductor device 10 can be electrically connected to outside through the lead frame (not shown in the figures).

In this embodiment, as stated above, the peripheral protrusion 16 is formed on the peripheral edge portion of the semiconductor substrate 11. The shape of the peripheral protrusion 16 can be, for example, a curved shape showing tilt upward toward the surroundings and convex upward. Therefore, in the peripheral edge portion of the semiconductor device 10, not only the conductive adhesive 24 is used to weld the semiconductor device 10, but also the reinforcement of the peripheral protrusion 16, the bonding strength of the semiconductor device 10 packaged on the package substrate 22 can be enhanced.

In addition, when the semiconductor device 10 is packaged on the package substrate 22, a conductive or semi-solid conductive adhesive 24 is coated on the conductive path 23 of the package substrate 22, and then the semiconductor device 10 is placed on the conductive adhesive 24 and the conductive adhesive 24 is cured. In this embodiment, on the peripheral edge portion of the semiconductor device 10, the peripheral protruding portion 16 protruding downward is in contact with the peripheral edge portion of the conductive adhesive 24. From this, it can be seen that the liquid or semi-solid conductive adhesive 24 can be supported so as to surround the periphery of the peripheral protruding portion 16 of the semiconductor device 10, and the excessive flow of the conductive adhesive 24 to the surroundings can be prevented.

Figure 2A:
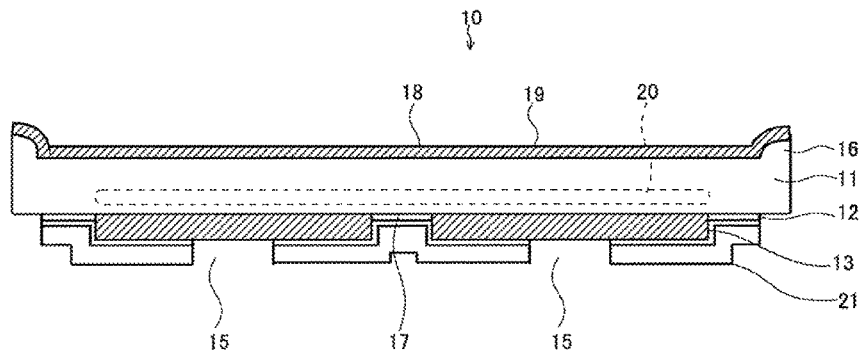
Figure 2B:
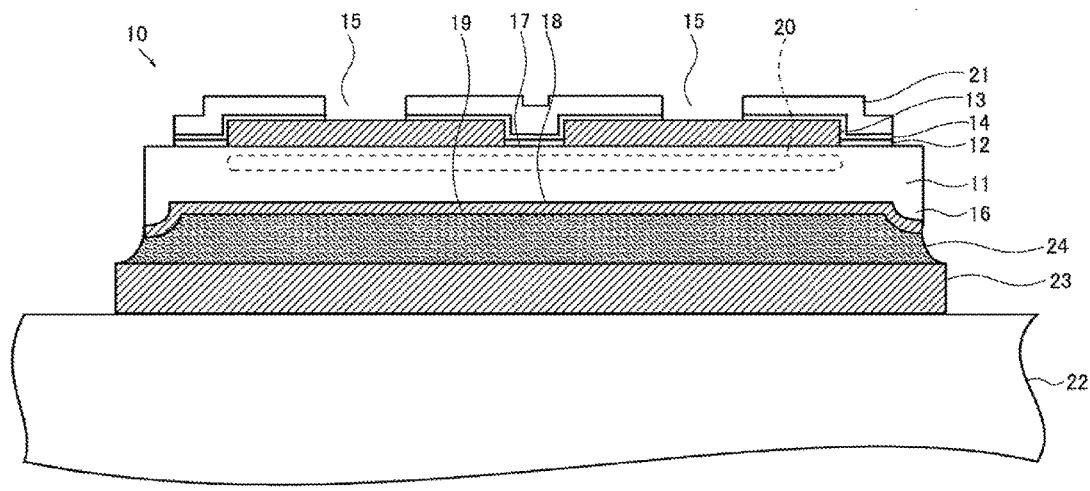

Please refer to FIG. 2A and FIG. 2B. FIG. 2A and FIG. 2B illustrate schematic diagrams of the semiconductor device 10 in another embodiment of the invention. The structure of the semiconductor device 10 in FIG. 2A and FIG. 2B is basically the same with that in FIG. 1. The only difference is that the semiconductor device 10 in FIG. 2A and FIG. 2B includes a back metal 19. FIG. 2A is a cross-sectional diagram of the semiconductor device 10 and FIG. 2B is a cross-sectional diagram of the semiconductor device packaging structure.

Please refer to FIG. 2A. The second surface 18 of the semiconductor substrate 11 is covered by the back metal 19. The back metal 19 can be made of, for example, gold, silver, copper, or alloys or a laminate thereof. The back metal 19 covers the entire second surface 18 also including the peripheral protruding portion 16. The thickness of the back metal 19 can be, for example, 1 µm to 50 µm. The electrical resistance can be reduced by electrically connecting the diffusion region 20 with the back metal 19.

Please refer to FIG. 2B. The back metal 19 is formed on the second surface 18 of the semiconductor substrate 11. The semiconductor device 10 is packaged on the conductive path 23 of the package substrate 22 with the conductive adhesive 24. Compared to a semiconductor material such as silicon, since the wettability of the back metal 19 with respect to the conductive adhesive 24 such as a solder is preferable, the packaging strength of the semiconductor device 10 using the conductive adhesive 24 can be enhanced.

Please refer to FIG. 3A~FIG. 7B. FIG. 3A~FIG. 7B illustrate the method of manufacturing the semiconductor device 10 having the above-mentioned structure. The semiconductor device manufacturing method in this embodiment includes: a preparing step of preparing the semiconductor wafer 30, a removing step of removing the thick portion of the semiconductor wafer 30, and a cutting step of cutting the semiconductor wafer 30. These steps will be described in detail below.

Figure 3A:
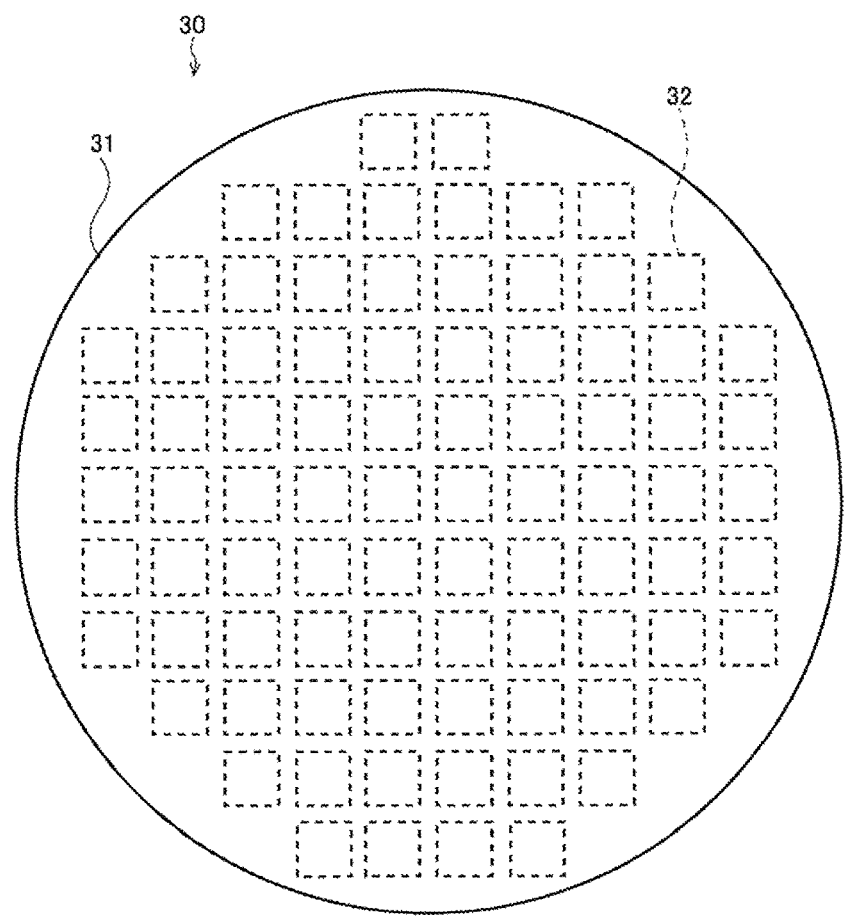
Figure 3B:
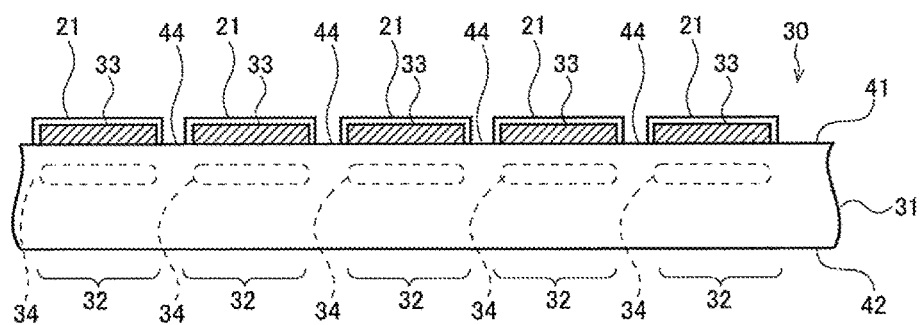

Please refer to FIG. 3A and FIG. 3B. FIG. 3A and FIG. 3B illustrate the semiconductor wafer 30 prepared in the preparing step. FIG. 3A is a plan view of the semiconductor wafer 30 and FIG. 3B is a cross-sectional diagram of semiconductor wafer 30.

Please refer to FIG. 3A. The semiconductor wafer 30 has a disk shape, and a plurality of semiconductor device portions 32 are formed in a matrix, for example, a transistor formed by a plurality of diffusion regions.

Please refer to FIG. 3B. The semiconductor wafer 30 includes a semiconductor substrate 31 formed by the semiconductor material such as silicon. The thickness of the semiconductor substrate 31 before the grinding process is, for example, approximately 600 μm. The semiconductor wafer 30 has an upward first surface 41 and a downward second surface 42. In each semiconductor device portion 32, a diffusion region 34 is formed near the first surface 41. A conductive pattern 33 electrically connected with the diffusion region 34 is formed on the first surface 41. In addition, as described in FIG. 1A, the conductive pattern 33 is covered by the resin film 21 or the like. Furthermore, a grid-like scribe line 44 is formed between the semiconductor device portions 32, and the oxide film 12, the passivation layer 14, and the oxide film 12 shown in FIG. 1 are removed on the scribe line 44.

Please refer to FIG. 4A~FIG. 5C. FIG. 4A~FIG. 5C illustrate a back grinding step of reducing the substrate thickness of the semiconductor wafer 30.

Figure 4A:
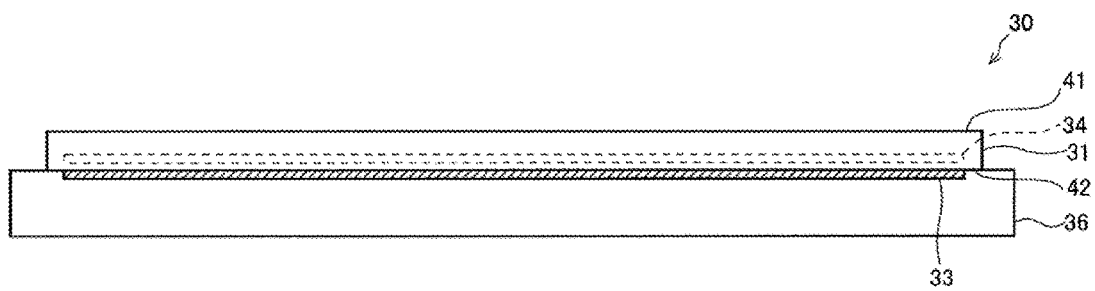

Please refer to FIG. 4A. At first, the second surface 42 of the semiconductor wafer 30 is adhered to the backside grinding tape 36 (the first tape). In this embodiment, when the semiconductor wafer 30 is grinded, the back grinding tape 36 has a hardness that allows a portion of the semiconductor wafer 30 to bend. Specifically, the backside grinding tape 36 acts on the downward pressure provided by the grinder 35 via the semiconductor wafer 30 during back grinding. At this time, even if the downward pressure acts, the upper surface of the back grinding tape 36 is not greatly deformed depending on the uneven shape formed by the conductive pattern 33 on the lower surface of the semiconductor wafer 30. Therefore, a gap is formed between the first surface 41 of the semiconductor wafer 30 and the upper surface of the back grinding tape 36 at the portion where no conductive pattern 33 is formed.

Therefore, if the thickness of the semiconductor wafer 30 is reduced to about 100 μm by the back grinding process, the downward pressure may be applied to the semiconductor wafer 30 by the grinder 35, and the first surface 41 of the semiconductor wafer 30 can be bent downward where the gap is formed, as described with reference to FIG. 5.

Figure 4B:
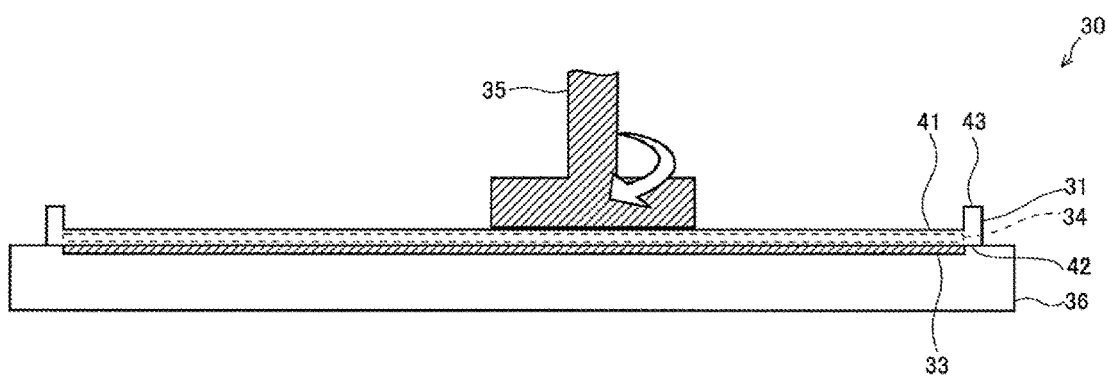

Please refer to FIG. 4B. Next, the semiconductor wafer 30 is grinded by a grinder 35 of a grinding apparatus. Specifically, the grinder 35 is used to grind a part of the semiconductor wafer 30, where the above-mentioned diffusion regions 34 of the semiconductor device portions 32 are formed, from the second surface 42. In this step, since the peripheral edge portion of the semiconductor wafer 30 is not grinded, the peripheral edge portion of the semiconductor wafer 30 forms a thicker annular thick portion 43 than the central portion of the semiconductor wafer 30 to ensure the rigidity of the entire semiconductor wafer 30 and make the operation of the semiconductor wafer 30 in the semiconductor device manufacturing process become easy, thereby the semiconductor wafer 30 can be prevented from warping. With the grinding operation in this step, the thickness of the central portion of the semiconductor wafer 30 can be, for example, 50 μm to 100 μm.

Please refer to FIG. 5A. In this step, the semiconductor wafer 30 is grinded from the second surface 42 by a grinder 35 rotating at a high speed, and the thickness of the semiconductor wafer 30 can be reduced to, for example, 100 μm or less. At this time, the grinder 35 applies downward pressure to the semiconductor wafer 30. In addition, the conductive pattern 33 with a thickness of, for example, about 3 μm can be formed on the first surface 41 of the semiconductor wafer 30 attached to the back grinding tape 36. Moreover, the conductive pattern 33 is covered with the resin film 21 having a thickness of about 10 μm. In addition, the scribe line 44 is formed between the semiconductor device portions 32 by removing the resin film 21 and the like. Therefore, the first surface 41 of the semiconductor wafer 30 can have a concavo-convex shape corresponding to the thickness of the conductive pattern 33, the resin film 21 and the like. The step length of this concavo-convex shape can be about 13 μm, for example. Furthermore, as mentioned above, the back grinding tape 36 is made of a material having a sufficient hardness to support the semiconductor wafer 30.

From this, it can be seen that the second surface 42 of the semiconductor wafer 30 is grinded by the grinder 35 to thin the semiconductor wafer 30, and a part of the semiconductor wafer 30 on the back grinding tape 36 is deformed because of contacting with the first surface of the semiconductor wafer 30 having the concave-convex shape. Therefore, between the semiconductor device portions 32 where no conductive pattern 33 is formed, the semiconductor wafer 30 can be bent downward in a convex shape on the paper surface.

Please refer to FIG. 5B. As described above, the semiconductor wafer 30 is sufficiently thinned by the back grinding process. In the back grinding step, as described above, the semiconductor wafer 30 is bent and a rib-shaped portion 37 is formed between the semiconductor device portions 32. In other words, on the second surface 42 of the semiconductor wafer 30, a device pattern indicating the arrangement configuration of the semiconductor device portions 32 is transferred. For example, the rib-shaped portion 37 can be a portion where the second surface 42 of the semiconductor wafer 30 is raised upward in a curved shape. The protruding height of the rib-shaped portion 37 can be greater than 5 μm and less than 10 μm. In addition, the first surface 41 of the semiconductor wafer 30 is flat or slightly flat.

Please refer to FIG. 5C. Since the rib-shaped portions 37 are formed between the semiconductor device portions 32, they are formed in a grid shape as a whole. The rib-shaped portion 37 formed on the second surface 42 of the semiconductor wafer 30 in this step is used as an alignment mark in the following cutting step. Further, in the cutting step, the rib-shaped portions 37 can be used to relax the stress acting on the semiconductor wafer 30. In this embodiment, the rib-shaped portion 37 is formed near the central portion of the semiconductor wafer 30 in a straight line and does not reach the peripheral edge portion of the semiconductor wafer 30.

Please refer to FIG. 6. Next, the semiconductor wafer 30 is cut to separate each of the semiconductor device portions 32 individually. In this step, the semiconductor wafer 30 does not have to be separated from the back grinding tape 36, and a cutting tape 38 (the second tape) is adhered on the bottom surface of the back grinding tape 36. In this condition, the cutter 39 is used to cut the semiconductor wafer 30. In addition, before the semiconductor wafer 30 is cut, the annular thick portion 43 formed on the peripheral edge portion of the semiconductor wafer 30 is removed (as shown in FIG. 4B).

In this step, the semiconductor wafer 30 is aligned with the cutter 39 through the rib-shaped portion 37 formed on the second surface 42 of the semiconductor wafer 30. Specifically, the rib-shaped portion 37 formed on the second surface 42 of the semiconductor wafer 30 can be photographed with a photographing device such as a camera, and the position of the rib-shaped portion 37 can be calculated by performing image process on the captured image.

Next, by adjusting the positions of the cutter 39 of the cutting device and the semiconductor wafer 30, the lateral central portion of the rib-shaped portion 37 and the lateral central portion of the cutter 39 are aligned. Then, the cutter 39 rotating at high speed is lowered, and the cutter 39 is moved linearly along the rib-shaped portion 37 to cut the semiconductor wafer 30. This cutting step is performed on each rib-shaped portion 37 shown in FIG. 5C. In other words, the semiconductor wafer 30 is cut into a lattice shape along the rib-shaped portions 37. In this way, the semiconductor wafers 30 can be individualized by using the rib-shaped portions 37 as boundaries. In addition, each semiconductor device portions 32 separated from the back grinding tape 36 can be conveyed by the pickup apparatus generally used. As a result, the peripheral protrusion shown in FIG. 1A can be formed.

In this step, the semiconductor wafer 30 does not have to be separated from the back grinding tape 36, and the semiconductor wafer 30 is adhered by the cutting tape 38 through the backside grinding tape 36. Specifically, the back grinding tape 36 is adhered to the first surface 41 of the semiconductor wafer 30, and the cutting tape 38 is adhered to the back grinding tape 36.

Therefore, in this embodiment, when the cutting step is performed, since the step of separating the back grinding tape 36 from the semiconductor wafer 30 can be omitted, it is possible to prevent the thin semiconductor wafer 30 from being damaged when the back grinding tape 36 is separated from the semiconductor wafer 30.

In addition, in this embodiment, when the semiconductor wafer 30 is cut by the cutter 39, since a thick rib-shaped portion 37 is formed on the semiconductor wafer 30, the stress applied by the cutter 39 can be relieved. Therefore, it is possible to suppress the damage of the semiconductor wafer 30 during cutting.

Further, please refer to FIG. 5A. In this embodiment, an inexpensive back grinding tape 36 is used for back grinding and the back grinding tape 36 is used for the semiconductor wafer having a thickness of greater than or equal to 100 μm. Therefore, since the special back grinding tape having a concave-convex shape is not used, the manufacturing cost can be reduced.

Please refer to FIG. 7A and FIG. 7B. FIG. 7A and FIG. 7B are schematic diagrams illustrating other steps of cutting the semiconductor wafer 30. FIG. 7A and FIG. 7B are cross-sectional diagram of the cutting step.

Please refer to FIG. 7A. a back metal 40 made of a metal film such as aluminum is formed on the second surface 42 of the semiconductor wafer 30. After the above grinding step is completed, the back metal 40 can be formed by forming a film on the second surface 42 of the semiconductor wafer 30 by, for example, an electroplating method. The back metal 40 covers the second surface 42 of the semiconductor wafer 30 including the rib-shaped portion 37. The back metal 40 can provide a function of reducing resistance; for example, the back metal 40 can be electrically connected to the diffusion regions 34 of the transistors of the semiconductor device portions 32.

Please refer to FIG. 7B. After aligning the semiconductor wafer 30 and the cutter 39 with the rib-shaped portion 37 as an alignment mark, the semiconductor wafer 30 is cut by the cutter 39. The cutting in this step is the same as described in FIG. 6.

By performing the above steps, the plurality of semiconductor device portions 32 covered by the back metal 40 on the second surface 42 can be separated from each other.

Although the different embodiments of the present invention have been described above, the present invention is not limited thereto and can be modified without departing from the scope of the present invention.

In the above-described embodiments, the so-called TAIKO process is used as a method for manufacturing semiconductor devices. However, according to FIG. 4B, it can be seen that the method of manufacturing an ordinary semiconductor device without the annular thick portion 43 formed around the semiconductor wafer 30 can also be applied to the above embodiments.

Moreover, in the above embodiment, although the cutter 39 is used as an example for cutting, other cutting methods such as laser cutting may also be used, but not limited thereto.

What is claimed is:

1. A semiconductor device, comprising:
  a semiconductor substrate having a first surface and a second surface opposite to the first surface, wherein a diffusion region is formed in the semiconductor substrate;
  a conductive pattern formed on the first surface and electrically connected with the diffusion region; and
  a peripheral protrusion formed at a peripheral portion of the second surface and protruding outwardly along a thickness direction.

2. The semiconductor device of claim 1, wherein the second surface with the peripheral protrusion is covered by a back metal.

3. A semiconductor wafer, comprising:
  a semiconductor substrate, wherein a plurality of semiconductor device portions is arranged in matrix on the semiconductor substrate;
  a first surface, wherein a conductive pattern is disposed on the first surface and electrically connected with a diffusion region formed in the semiconductor device portion;
  a second surface opposite to the first surface; and
  a rib-shaped portion, formed on the second surface corresponding to a region between the semiconductor device portions, protruding outwardly along a thickness direction and formed in a lattice shape as a whole.

4. The semiconductor wafer of claim 3, wherein the second surface with the rib-shaped portion is covered by a back metal.

5. A semiconductor device manufacturing method, comprising:
  a preparation step of preparing a semiconductor wafer, comprising:
   arranging a plurality of semiconductor device portions in matrix on a semiconductor substrate;
   disposing a conductive pattern on a first surface wherein the conductive pattern is electrically connected with a diffusion region formed in the semiconductor device portion; and
   providing a second surface opposite to the first surface;
  a removal step of removing a thickness part of the semiconductor wafer corresponding to the semiconductor device portion from the second surface; and
  a cutting step of cutting the semiconductor wafer into the semiconductor device portion,
   in the removal step, a rib-shaped portion protruding outwardly along a thickness direction is formed on the second surface corresponding to a region between the semiconductor device portions,
   in the cutting step, cutting the semiconductor wafer along the rib-shaped portion.

6. The semiconductor device manufacturing method of claim 5, wherein in the removal step, a thickness of a peripheral portion of the semiconductor wafer is kept.

7. The semiconductor device manufacturing method of claim 5, wherein in the removal step, under a condition that the first surface of the semiconductor wafer is adhered with a first tape, the second surface of the semiconductor wafer is pushed and grinded by a grinder, and the semiconductor wafer corresponding to a region between the semiconductor device portions is deformed toward the first surface to form the rib-shaped portion on the second surface corresponding to the region between the semiconductor device portions.

8. The semiconductor device manufacturing method of claim 7, wherein in the cutting step, the semiconductor wafer is cut under the condition that the first surface of the semiconductor wafer is adhered with the first tape.

9. The semiconductor device manufacturing method of claim 8, wherein in the cutting step, the semiconductor wafer is cut under the condition that the first tape is adhered with a second tape.

10. The semiconductor device manufacturing method of claim 6, wherein in the removal step, under a condition that the first surface of the semiconductor wafer is adhered with a first tape, the second surface of the semiconductor wafer is pushed and grinded by a grinder, and the semiconductor wafer corresponding to a region between the semiconductor device portions is deformed toward the first surface to form the rib-shaped portion on the second surface corresponding to the region between the semiconductor device portions.

* * * * *